(12) United States Patent
Beernink

(10) Patent No.: US 6,423,595 B1
(45) Date of Patent: Jul. 23, 2002

(54) METHOD FOR SCRIBING A SEMICONDUCTOR DEVICE

(75) Inventor: Kevin Beernink, Clarkston, MI (US)

(73) Assignee: United Solar Systems Corporation, Troy, MI (US)

( * ) Notice: Subject to any disclaimer, the term of this patent is extended or adjusted under 35 U.S.C. 154(b) by 0 days.

(21) Appl. No.: 09/838,509

(22) Filed: Apr. 19, 2001

(51) Int. Cl.7 .......................................... H01L 21/8242
(52) U.S. Cl. ........................ 438/250; 438/244; 438/255
(58) Field of Search ........................ 438/96, 244, 250, 438/255

(56) References Cited

U.S. PATENT DOCUMENTS

| | | | |
|---|---|---|---|
| 4,451,970 A | 6/1984 | Izu et al. | 29/574 |
| 4,464,823 A | 8/1984 | Izu et al. | 29/572 |
| 4,510,674 A | 4/1985 | Izu et al. | 29/574 |
| 4,510,675 A | 4/1985 | Izu et al. | 29/574 |
| 5,268,037 A | 12/1993 | Glatfelter | 136/249 |
| 5,457,057 A | 10/1995 | Nath et al. | 437/2 |
| 6,011,215 A | 1/2000 | Glatfelter et al. | 136/249 |
| 6,168,968 B1 * | 1/2001 | Umemoto et al. | 438/96 |
| 6,288,323 B1 * | 9/2001 | Hayashi et al. | 136/244 |

* cited by examiner

*Primary Examiner*—David Nelms
*Assistant Examiner*—Reneé R. Berry
(74) *Attorney, Agent, or Firm*—Gifford, Krass, Groh, Sprinkle, Anderson & Citkowski, P.C.

(57) ABSTRACT

There is disclosed herein a method for scribing the top electrode of semiconductor devices. According to the method, a scribe region of the top electrode is defined by creating a high electrical resistance perimeter there around. A channel having relatively high electrical conductivity is formed between the scribe region of the top electrode and the bottom electrode of the device. The device is then subjected to an electroconversion process wherein a current flow via the conductive path, and through the scribe region of the electrode, causes the bath to render the top electrode material in the scribe area nonconductive.

19 Claims, 3 Drawing Sheets

METHOD FOR SCRIBING A SEMICONDUCTOR DEVICE

FIELD OF THE INVENTION

This invention relates generally to semiconductor devices. More specifically, the invention relates to large area, thin film semiconductor devices such as photovoltaic devices; and most specifically, the invention relates to a method for scribing portions of a large area semiconductor device.

BACKGROUND OF THE INVENTION

Advances in semiconductor technology have made possible the preparation of large area, high quality, thin film semiconductor materials by high volume deposition techniques. This has made possible the manufacture of very large area semiconductor devices such as photovoltaic devices, photo sensor arrays, memory arrays, displays and the like. Such devices typically comprise a number of layers of semiconductor material, insulator material and electrode material in various stacked relationships; and, in the course of fabricating semiconductor devices, it is necessary to scribe various of these layers. For example, very large area photovoltaic devices are often scribed to configure the materials into interconnected series, parallel, or mixed series/parallel arrays of subcells. Likewise, scribing is necessary in the fabrication of other device arrays.

Photovoltaic devices, and many other semiconductor devices, comprise one or more layers of semiconductor material interposed between a bottom electrode material and a top electrode material, and it is often necessary or desirable to scribe the top electrode material into a plurality of separate regions. Owing to the relatively high lateral electrical resistivity of thin film semiconductor materials, such scribed regions are effectively electrically isolated. Accordingly, a number of techniques have been implemented in the art for scribing such materials. Scribing can be carried out by chemical processes such as etching or by mechanical processes such as water jet abrasion.

Laser techniques are particularly preferred for scribing large area semiconductor devices since such techniques can form relatively small features, and since the position of the laser beam can be controlled with a high degree of precision. Laser techniques are known in the art; for example, such techniques are shown in U.S. Pat. Nos. 5,268,037 and 5,457,057. While a laser beam may be accurately positioned, control of delivered power can present problems. The output power of the laser can fluctuate, unless expensive power supplies and regulators are employed. Also, minor variations in the thicknesses of the relatively thin semiconductor and electrode layers may occur thereby causing irregularities in scribing even if the laser output is highly stable. Excess laser power can damage subjacent and adjacent portions of semiconductor material thereby short circuiting a semiconductor device or rendering it otherwise inoperable. If the power delivered is too low, scribing may not be complete and electrical isolation compromised also resulting in an inoperative device.

There is thus a need for a method for scribing large area semiconductor devices, and particularly top electrodes of large area semiconductor devices, which method is accurate and precise with regard to geometric positioning, and which is capable of producing consistent scribing results. This method should also be compatible with conventional processing techniques and equipment, and should be fast and simple to implement. As will be described hereinbelow, the present invention provides a highly controllable, laser based, accurate, scribing method which may be readily adapted to techniques for the fabrication of various large area semiconductor devices.

BRIEF DESCRIPTION OF THE INVENTION

There is disclosed herein a method for scribing the top electrode of a semiconductor device which device includes a top electrode, a bottom electrode and a body of semiconductor material disposed therebetween. In a first step of the method, a scribed area is defined on the top electrode. The scribed area is separated from the remainder of the top electrode by a high resistance portion of the top electrode. This high resistance portion has a lateral, or sheet, resistance which is greater than the electrical resistance of the top electrode in either the scribed area or the remainder of the device. In particular embodiments of the invention, the high resistance portion of the top electrode is formed by directing a laser beam onto the top electrode so as to remove at least some of the top electrode material thereby forming the high resistance portion.

In a second step of the method, the electrical resistivity of a portion of the semiconductor body is decreased, and this portion of decreased resistivity provides a lower resistivity path which extends between the bottom electrode and the scribed area of the top electrode. In particular embodiments of the invention, the decreased resistivity of the semiconductor body is accomplished by heating the semiconductor body, for example by laser heating.

Subsequently, the semiconductor device is disposed in an electroconversion bath and an electrical current is flowed through the device from the bottom electrode, through the portion of semiconductor-decreased resistivity, and through the scribed area of the top electrode. This current causes the electroconversion bath to oxidize the top electrode material in the scribed area thereby making it electrically resistive.

DETAILED DESCRIPTION OF THE INVENTION

The present invention provides a method for scribing the top electrode material of semiconductor devices of the type which include a top electrode, a bottom electrode and a body of semiconductor material disposed therebetween. The method of the present invention employs a first scribing step, which is typically carried out by laser scribing, and which serves to create high resistance regions in the top electrode, which regions bound, and at least partially electrically isolate, the area of the top electrode to be scribed. This step does not require a high degree of control of laser output.

In a second step, a high conductivity path is established between the bottom electrode of the device and the isolated area of the top electrode which is to be scribed. This step is most preferably carried out by directing a relatively high power laser through the semiconductor device for the purpose of crystallizing, and/or otherwise rendering electrically conductive, portions of the semiconductor body.

In a subsequent step, the device is disposed in an electrochemical conversion bath. Electrical contact is made to the bottom electrode of the device, and a counter electrode is placed in the bath, in proximity to the top electrode of the device. A current is passed between the counter electrode and the bottom electrode, and this flow of current passes through the portion of top electrode material isolated in the scribe area because of the presence of the low resistivity path. This flow of current causes the electroconversion bath to oxidize the top electrode material in the scribe area.

Figure 1:
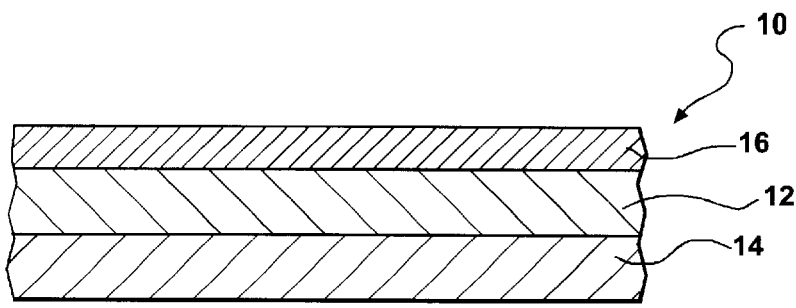
FIG. 1 is a cross-sectional view of a semiconductor device, of the type which may be scribed by the present invention.

Referring now to FIG. 1, there is shown a stylized semiconductor device 10, which is of the type which may be scribed according to the present invention. As shown, the device 10 includes a body of semiconductor material 12 interposed between a layer of bottom electrode material 14 and a layer of top electrode material 16. The semiconductor material 12 is shown for purposes of illustration as being a single layer; although it is to be understood that in most instances, this body of material 12 may comprise a number of separate layers of semiconductor material which may be amorphous, microcrystalline, polycrystalline, or at least partially crystalline. The bottom electrode material 14 may comprise a layer of metal or a high conductivity, highly degenerate semiconductor material such as a transparent conductive metal oxide (TCO), an electrically conductive polymer or the like. Although not illustrated, in some instances, the device 10 may be disposed on a substrate which may be an electrically insulating substrate. Alternatively, the bottom electrode layer 14 may be a relatively thick body of material and may function as a substrate. The device 10 of FIG. 1 includes a layer of top electrode material 16. This layer of electrode material 16 may be generally similar to the bottom electrode material 14; however, the present invention has been found to be most advantageous for scribing top electrode layers prepared from transparent, electrically conductive oxide (TCO) materials such as indium oxide, tin oxide, zinc oxide and the like, either singly or in combination. Such TCO materials are often employed as electrodes in photo responsive devices such as photovoltaic cells, photo detectors, displays and the like.

Figure 2:
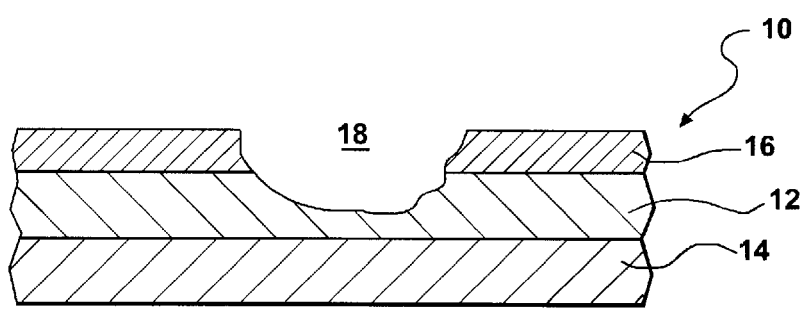
FIG. 2 is a cross-sectional view of the semiconductor device of FIG. 1 as scribed by a prior art process.

Referring now to FIG. 2, there is shown a cross-sectional view of a semiconductor device generally similar to the device 10 of FIG. 1 which has been scribed by a prior art laser scribing process. As will be seen, the scribed line 18 formed in the device 10 of FIG. 2 is somewhat irregular in cross section, and extends well into the semiconductor body 12. This is a result of problems of power control and delivery as discussed above. Such penetration of the laser beam into the semiconductor layer 12 can cause damage to the semiconductor layer. Specifically, the laser beam can create high conductivity regions in the semiconductor body by crystallizing or otherwise changing the properties of the semiconductor material, and such high conductivity regions can short circuit the device. In the prior art method of FIG. 2, the laser beam must eject relatively large amounts of electrode material, and incidentally can eject semiconductor material and even electrode material if precise control is not achieved. This ejected material will accumulate on the surface of the device and can cause short circuiting or other damage. The present invention eliminates such problems.

Figure 3:
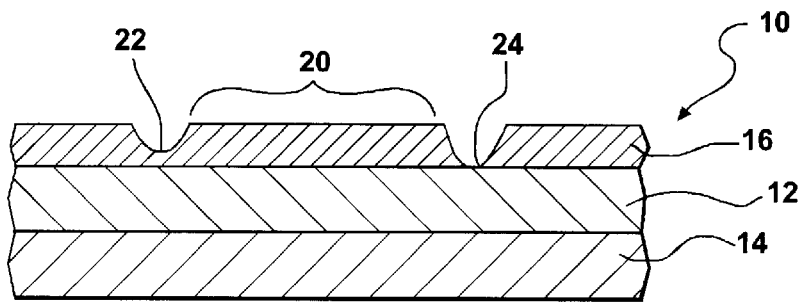
FIG. 3 is a cross-sectional view of the semiconductor device of FIG. 1 at a first stage in the scribing process of the present invention.

Referring now to FIG. 3, there is shown a first step in the process of the present invention, as carried out on a semiconductor device 10 generally similar to that discussed above. In this first step, a scribe area 20 is defined on the top electrode layer 16. This scribe area 20 is bounded by portions of the top electrode which have a lateral resistance greater than the electrical resistance of the scribe region 20 itself, or the remainder of the top electrode. As illustrated herein, the high lateral resistance portions of the top electrode 16 are defined by a pair of grooves 22, 24 cut into the top electrode material. As will be seen from FIG. 3, groove 22 is cut only partway through the top electrode layer 16, while groove 24 is cut all the way through the top electrode layer 16. In some instances, the groove may penetrate a short distance into the semiconductor material itself. This illustrates the fact that very precise control of the laser power is not required in the practice of the present invention. Since the thickness of the top electrode material is less than that of the remainder of the top electrode material, the electrical resistance of the top electrode, as measured through its thickness, is significantly greater in this area than in the remainder of the top electrode layer even if the cut is only partway through. As a result, the scribe area 20 is at least partially electrically isolated from the remainder of the top electrode layer 16.

The grooves in the FIG. 3 embodiment are most preferably formed by a laser scribing process. However, the laser scribing process need not be under as accurate a control as was required by prior art methods. First of all, as will be described in detail hereinbelow, the grooves need not completely sever the top electrode layer, since scribing will actually be accomplished electrochemically. Secondly, the grooves are relatively narrow, and hence may be formed relatively quickly, and without danger of harming the semiconductor device with ablated material.

Figure 4:
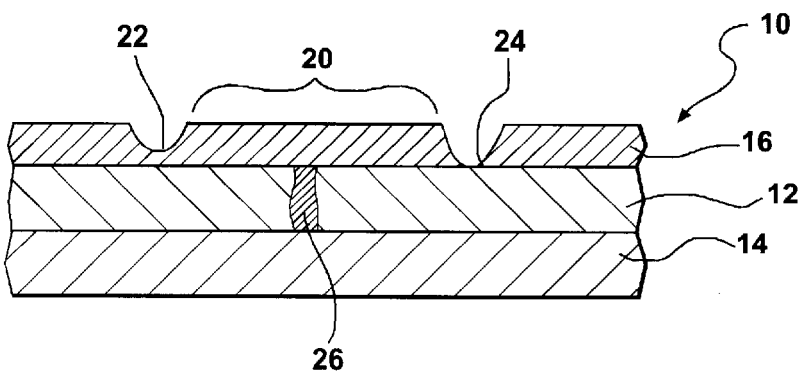
FIG. 4 is a cross-sectional view of the device of FIG. 3 at a further stage in its processing.

Referring now to FIG. 4, there is shown a subsequent step in the present invention. In this step, the electrical resistivity of a portion of the semiconductor body 12 is decreased so as to provide a low resistivity path which extends between the scribe region 20 and the bottom electrode 14. This path 26 is most preferably formed by laser irradiation of the semiconductor body 12. As is known in the art, and as is described, for example, in U.S. Pat. No. 6,011,215, which is incorporated herein by reference, a beam of energy of sufficiently high intensity can convert a thin film semiconductor material to a material having a higher electrical conductivity. In those instances where a semiconductor is a disordered semiconductor material such as an amorphous, nanocrystalline, microcrystalline or polycrystalline material, the heating may possibly convert the material to a more crystalline form. It is believed that, in some instances, the low resistivity path is formed, at least in part, as a result of material from the top electrode coming into contact with material from the bottom electrode, through diffusion, or through a hole formed through the layers therebetween. In any case, it has been found that such heating can significantly change the conductivity of thin film semiconductor materials. In one particularly preferred embodiment, the channel is formed by irradiation with an Nd YAG laser having an output at 1.06 microns. While heating is most advantageously carried out by a laser beam, other sources of heat such as a noncoherent light beam, an electron beam or a heated probe may be similarly employed.

The layers of a typical semiconductor device are very thin, typically in the micron to sub-micron range. Electrical conductivity of most thin film semiconductor materials is only modest; therefore, lateral electrical conduction through such thin film semiconductor layers is negligible compared to conduction through the thickness of the layer. In contrast, typical top electrode materials such as TCO materials are very good electrical conductors, and lateral conduction is considerable. In view of the foregoing, and with reference to FIG. 4, it will thus be appreciated that the presence of the conductive channel 26 provides a relatively low resistivity path for electrical current to flow from the bottom electrode 14 through the channel 26 and to the entirety of the scribe area 20. Since the remainder of the top electrode material 16 is separated from the scribe area by the higher resistance regions 22, 24, the remainder of the top electrode will not be in good electrical communication with the back electrode 14.

The high conductivity channel may be a single, continuous channel extending across a major portion of the scribe area; or it may comprise a number of separate channels. Also, it is to be understood that the scribe area may extend across the entirety of the top surface of a semiconductor device, or it may comprise one or more discrete areas.

Figure 5:
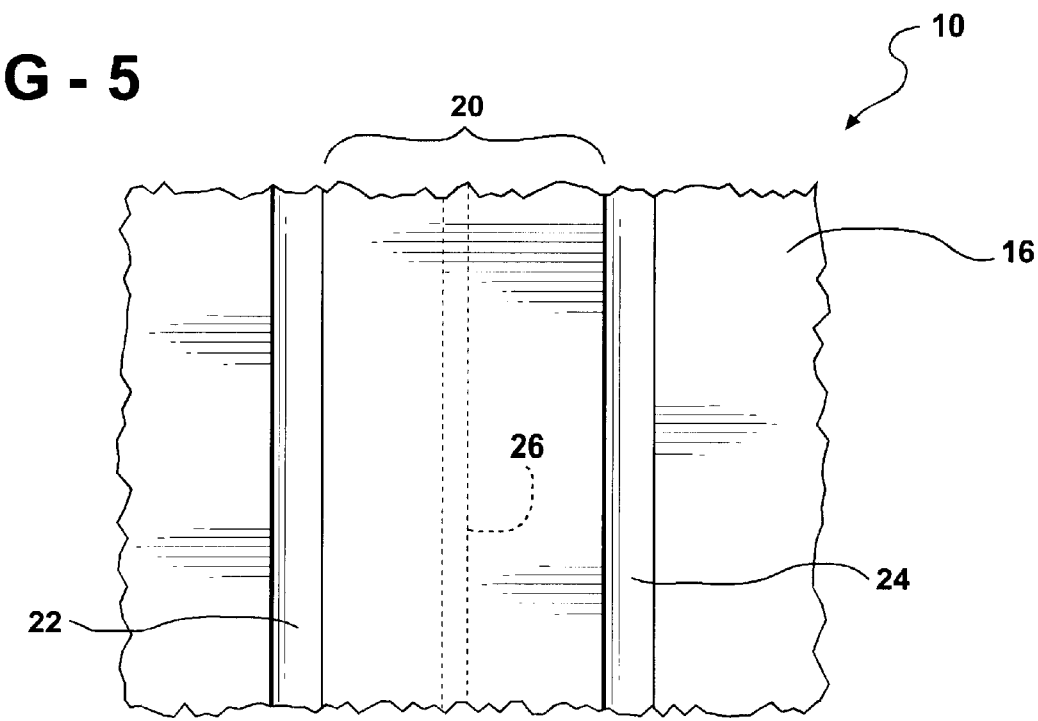
FIG. 5 is a top plan view of the device of FIG. 4.

FIG. 5 is a top view of a semiconductor device 10, of the type previously described, as viewed from the top electrode side thereof. Visible thereon is the top electrode 16 and the scribe area 20, which is separated from the remainder of the top electrode 16 by the high resistance grooves 22, 24. Also visible in the FIG. 5 drawing is the high conductivity channel. As will be seen, the scribe region 20 extends across the entire width of the device 10 and the channel 26 is a single, continuous channel formed through the full length of the scribe region 20.

Figure 6:
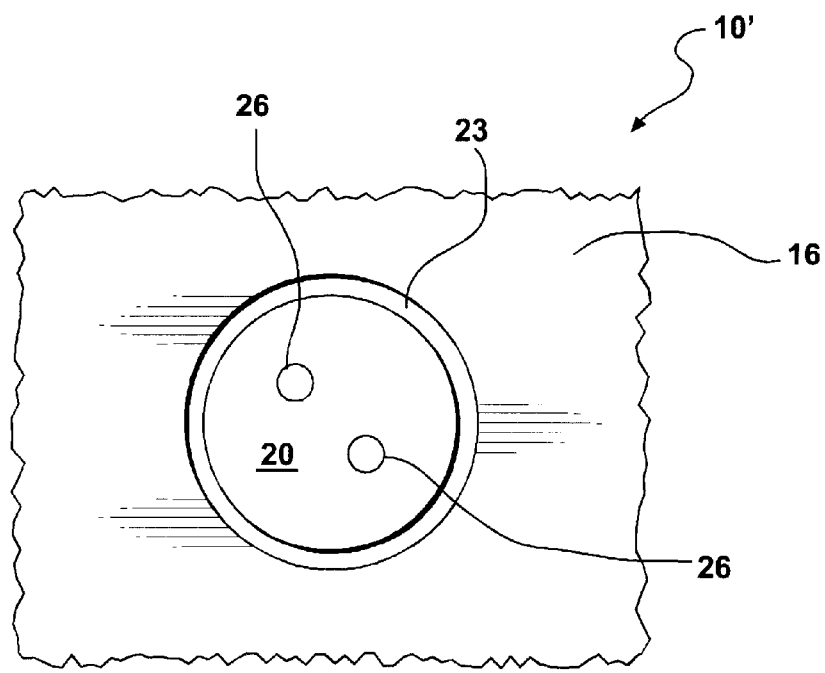
FIG. 6 is a top plan view of another configuration of scribe pattern in accord with the present invention.

Yet other arrangements are possible within the scope of the present invention. FIG. 6 depicts another semiconductor device 10' generally similar to those previously described. In this device 10', a circular scribe region 20 is defined by a single high resistivity groove 23, and two separate high conductivity channels 26 are formed therein.

Once the semiconductor device is configured as is shown in FIGS. 4–6, the scribing process may then be completed electrochemically. It is known in the art that top electrode material, and specifically TCO material of semiconductor devices, may be rendered nonconductive by treatment in an electroconversion bath. A process of this type is employed to passivate short circuit defects in photovoltaic devices, and is disclosed in U.S. Pat. Nos. 4,451,970; 4,464,823; 4,510,674 and 4,510,675, the disclosures of which are incorporated herein by reference. As is described therein, when a body of TCO material is placed in an acidic bath, and an electrical current is passed therethrough, the bath acts to oxidize the electrode material making it into a good electrical insulator. The oxidation process may involve some, or total, removal of the electrode material. In any case, the net effect is that the electrode material does not conduct electricity after having been treated in the electroconversion bath. Typically, the bath includes aluminum chloride and water.

Figure 7:
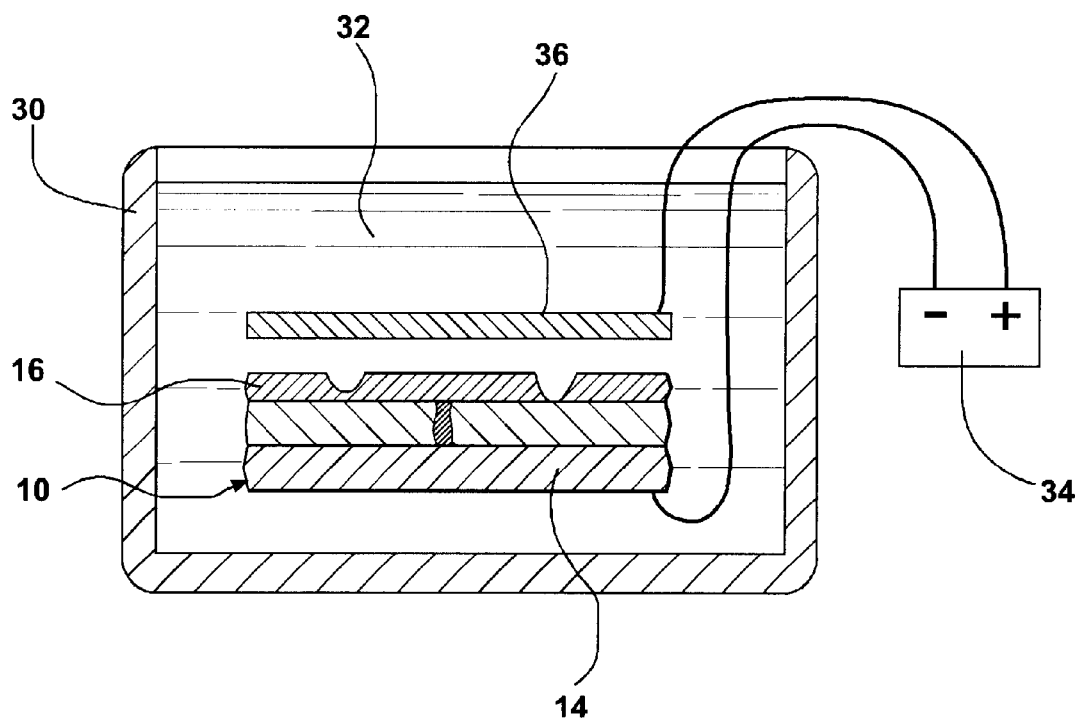
FIG. 7 is a cross-sectional view of the device of FIG. 4 as it is undergoing an electroconversion process.

Referring now to FIG. 7, there is shown the electroconversion step of the present invention. As depicted therein, a semiconductor device 10 as shown in FIG. 4 is placed in a container 30 having an electroconversion bath 32 therein. The bath, in one preferred embodiment, is comprised of deionized water and $Al_2Cl_3$ in an amount sufficient to achieve an electrical conductivity of about 10 ohm$^{-1}$. The negative terminal of a power supply 34 is connected to the bottom electrode 14 of the semiconductor device 10. A counter electrode 36 is disposed in the bath, in close proximity to the top electrode 16 of the device, and this counter electrode 36 is connected to the positive terminal of the power supply. The power supply is typically set at a voltage limit of 3.5 volts and a current limit of 0.1 A/cm$^2$ (as calculated on the basis of the scribe area 20). The process begins in a current-limited mode; and as the process proceeds, the voltage increases until the limit is reached, at which time current flow ceases.

In a typical process, the power supply is limited to 3.5 volts, and a current of 0.1 A/cm$^2$ is passed through the device for approximately twenty seconds. As discussed with reference to FIG. 4, the current preferentially passes through the shunt channel 26 to the scribe region 20 where it acts in cooperation with the bath 32 to render the electrode material in the scribe region nonconductive. After treatment is completed, the device is removed and may be processed further as required.

Figure 8:
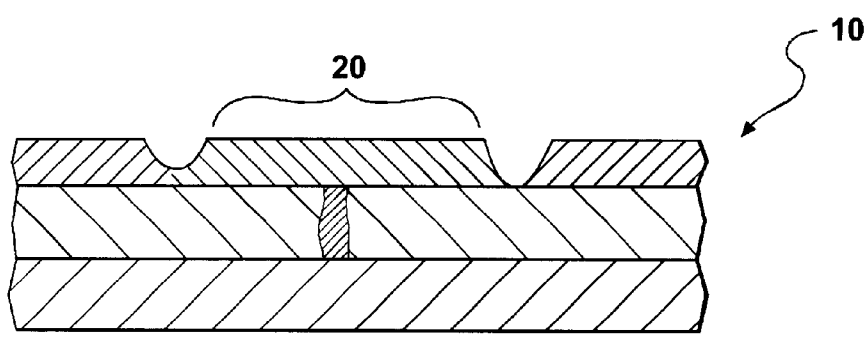
FIG. 8 is a cross-sectional view of a semiconductor device which has been scribed in accord with the present invention.

Referring now to FIG. 8, there is shown a cross section of the aforedescribed device 10. As indicated by the crosshatching, the electrode material in the scribe region 20 is rendered nonconductive; and as was discussed hereinabove, in some instances, this material is actually removed from the device, to at least some degree.

As described above, the processing of the device with regard to the formation of the high resistance regions in the top electrode, and the shunt channel in the semiconductor body, is carried out with lasers; however, other methods may be employed to practice the present invention. For example, the high resistance regions in the top electrode material may be formed by mechanical scribing, chemical etching or the like. Likewise, the high resistance regions may be formed at the time that the top electrode material is being deposited; as for example, by providing masking or some other type of deposition control. Likewise, other thermal methods may be employed to form the conductive channel; and in some instances, the channel may be formed by mechanical means such as physical penetration of the device. It should also be noted that while the channel is shown as passing through the entirety of the semiconductor body, a channel which passes only partway through the semiconductor body can still serve to establish a low resistivity path between the bottom and top electrodes.

In view of the foregoing, it is to be understood that numerous modifications and variations of the present invention may be implemented in accord with the teaching herein. The foregoing drawings, discussion and description are illustrative of some particular embodiments of the invention, but are not meant to be limitations upon the practice thereof. It is the following claims, including all equivalents, which define the scope of the invention.

What is claimed is:

1. A method of scribing a top electrode of a semiconductor device, said semiconductor device having a top electrode, a bottom electrode and a body of semiconductor material disposed therebetween, said method comprising the steps of:

providing a scribe area on said top electrode, said scribe area being separated from a remainder area of said top electrode by a high resistance portion of said top electrode having an electrical resistance which is greater than the electrical resistance of the top electrode in both said scribed area and said remainder area;

decreasing the electrical resistivity of a portion of said semiconductor body, said portion of decreased electrical resistivity providing a low resistivity path which extends between said scribe area and said bottom electrode;

providing an electrical power supply;

disposing said device in an electroconversion bath;

disposing a counter electrode in said electroconversion bath;

connecting the bottom electrode of said device to a first terminal of said power supply;

connecting said counter electrode to a second terminal of said power supply; and activating said power supply so as to provide a flow of current between said bottom electrode and said counter electrode, said flow of current passing through said low resistivity path and being operative to cause said electroconversion bath to oxidize the top electrode material in the scribe area;

whereby, said oxidized material does not conduct electricity.

2. The method of claim 1, wherein said step of providing a scribe area comprises directing a laser beam onto said top electrode, said laser beam having a power and wavelength sufficient to remove at least some of said top electrode material so as to define said portion of said top electrode.

3. The method of claim 2, wherein said laser is an excimer laser.

4. The method of claim 3, wherein said excimer laser has an output wavelength at 248 nanometers.

5. The method of claim 1, wherein the body of semiconductor material includes an amorphous semiconductor, and the step of decreasing the electrical resistivity of a portion of the semiconductor body comprises heating said amorphous semiconductor material to a temperature in excess of its crystallization temperature.

6. The method of claim 1, wherein the step of decreasing the electrical resistivity of a portion of the semiconductor body comprises directing a laser beam onto said portion of said semiconductor body.

7. The method of claim 6, wherein said laser comprises a neodymium doped YAG laser.

8. The method of claim 1, wherein the step of decreasing the electrical resistivity comprises decreasing the electrical resistivity of a portion of the semiconductor body which portion extends through the entire thickness of the semiconductor body.

9. The method of claim 1, wherein the step of decreasing the electrical resistivity of a portion of the semiconductor body comprises decreasing the electrical resistivity of a portion of the semiconductor body which extends through only a portion of the thickness of the semiconductor body.

10. The method of claim 2, wherein the step of disposing the device in an electroconversion bath comprises disposing the device in an aqueous solution of aluminum chloride.

11. The method of claim 1, wherein the bottom electrode is connected to the anode of the power supply and the counter electrode is connected to the cathode of the power supply.

12. The method of claim 1, wherein said top electrode comprises a transparent, electrically conductive oxide.

13. The method of claim 12, wherein said transparent, electrically conductive oxide includes indium tin oxide.

14. The method of claim 1, wherein said electrochemical oxidation of the top electrode material converts the top electrode material to an electrically resistive material.

15. The method of claim 1, wherein said electrochemical oxidation of said top electrode material removes at least a portion of said top electrode material.

16. A method for electrically isolating portions of a top electrode of a semiconductor device, said semiconductor device having a top electrode, a bottom electrode and a body of semiconductor material disposed therebetween, said method comprising the steps of:

directing a first laser beam onto the top electrode so as to form a scribe line in the surface of said top electrode, said scribe line having a high electrical resistance relative to an unscribed surface of said top electrode, said scribe line being disposed so as to electrically isolate a scribe area of said top electrode from a remainder portion thereof;

directing a second laser beam onto a portion of the electrode in the scribe area so as to form a low electrical resistance shunt in the body of semiconductor material disposed beneath the scribe area, said shunt providing a low resistance path between said scribe area and said bottom electrode;

providing a power supply having a cathode and an anode;

establishing electrical communication between the bottom electrode of said device and said anode;

disposing a counter electrode in said electrochemical bath, and establishing electrical communication between the cathode of said power supply and said counter electrode;

activating said power supply so as to establish a flow of electrical current from said bottom electrode, through said shunt in said body of semiconductor material, and through said scribe area and into said electroconversion bath; whereby said current causes the electrical resistivity of the top electrode material in said scribe area to increase.

17. A method of scribing a top electrode of a semiconductor device, said semiconductor device having a top electrode, a bottom electrode and a body of semiconductor material disposed therebetween, said method comprising the steps of:

providing a scribe area on said top electrode, said scribe area being separated from a remainder area of said top electrode by a high resistance portion of said top electrode having an electrical resistance which is greater than the electrical resistance of the top electrode in both said scribed area and said remainder area;

decreasing the electrical resistivity of a portion of said semiconductor body, which portion of decreased resistivity extends through the entire thickness of said semiconductor body, said portion of decreased electrical resistivity providing a low resistivity path which extends between said scribe area and said bottom electrode;

providing an electrical power supply;

disposing said device in an electroconversion bath;

disposing a counter electrode in said electroconversion bath;

connecting the bottom electrode of said device to a first terminal of said power supply;

connecting said counter electrode to a second terminal of said power supply; and activating said power supply so as to provide a flow of current between said bottom electrode and said counter electrode, said flow of current passing through said low resistivity path and being operative to cause said electroconversion bath to oxidize the top electrode material in the scribe area; whereby, said oxidized material does not conduct electricity.

18. A method of scribing a top electrode of a semiconductor device, said semiconductor device having a top electrode, a bottom electrode and a body of semiconductor material disposed therebetween, said method comprising the steps of:

providing a scribe area on said top electrode, said scribe area being separated from a remainder area of said top electrode by a high resistance portion of said top electrode having an electrical resistance which is greater than the electrical resistance of the top electrode in both said scribed area and said remainder area;

decreasing the electrical resistivity of a portion of said semiconductor body, which portion of decreased resistivity extends through only a portion of the thickness of the semiconductor body, said portion of decreased electrical resistivity providing a low resistivity path which extends between said scribe area and said bottom electrode;

providing an electrical power supply;

disposing said device in an electroconversion bath;

disposing a counter electrode in said electroconversion bath;

connecting the bottom electrode of said device to a first terminal of said power supply;

connecting said counter electrode to a second terminal of said power supply; and activating said power supply so as to provide a flow of current between said bottom electrode and said counter electrode, said flow of current passing through said low resistivity path and being operative to cause said electroconversion bath to oxidize the top electrode material in the scribe area; whereby, said oxidized material does not conduct electricity.

19. A method of scribing a top electrode of a semiconductor device, said semiconductor device having a top electrode, a bottom electrode and a body of semiconductor material disposed therebetween, said method comprising the steps of:

providing a scribe area on said top electrode, said scribe area being separated from a remainder area of said top electrode by a high resistance portion of said top electrode having an electrical resistance which is greater than the electrical resistance of the top electrode in both said scribed area and said remainder area; wherein said step of providing said scribe area comprises directing a laser beam onto said top electrode, said laser beam having a power and wavelength sufficient to remove at least some of said top electrode material so as to define said high resistance portion of said top electrode;

decreasing the electrical resistivity of a portion of said semiconductor body, said portion of decreased electrical resistivity providing a low resistivity path which extends between said scribe area and said bottom electrode;

providing an electrical power supply;

disposing said device in an electroconversion bath comprising an aqueous solution of aluminum chloride;

disposing a counter electrode in said electroconversion bath;

connecting the bottom electrode of said device to a first terminal of said power supply;

connecting said counter electrode to a second terminal of said power supply; and activating said power supply so as to provide a flow of current between said bottom electrode and said counter electrode, said flow of current passing through said low resistivity path and being operative to cause said electroconversion bath to oxidize the top electrode material in the scribe area; whereby, said oxidized material does not conduct electricity.

* * * * *